United States Patent
Liu et al.

(10) Patent No.: US 9,865,201 B2
(45) Date of Patent: Jan. 9, 2018

(54) PIXEL STRUCTURE, DISPLAY PANEL, DISPLAY DEVICE AND METHOD OF FABRICATING THE PIXEL STRUCTURE

(71) Applicants: Shanghai Avic Opto Electronics Co., Ltd., Shanghai (CN); Tianma Micro-Electronics Co., Ltd., Shenzhen (CN)

(72) Inventors: Bo Liu, Shanghai (CN); Jiongliang Fu, Shanghai (CN); Shoufu Jian, Shanghai (CN); Zhiqiang Xia, Shanghai (CN); Kerui Xi, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 372 days.

(21) Appl. No.: 14/465,737

(22) Filed: Aug. 21, 2014

(65) Prior Publication Data

US 2015/0279287 A1 Oct. 1, 2015

(30) Foreign Application Priority Data

Mar. 31, 2014 (CN) .......................... 2014 1 0126726

(51) Int. Cl.
*G06F 3/041* (2006.01)
*G09G 3/36* (2006.01)
(Continued)

(52) U.S. Cl.
CPC ............. *G09G 3/36* (2013.01); *G02F 1/1368* (2013.01); *G02F 1/13338* (2013.01);
(Continued)

(58) Field of Classification Search
CPC ............... G02F 1/13338; G02F 1/1368; G02F 1/134309; G02F 1/133514; G09G 3/3659;
(Continued)

(56) References Cited

U.S. PATENT DOCUMENTS 8,077,269 B2 * 12/2011 Kim ...................... H01L 27/124
257/E21.535
2002/0142649 A1 10/2002 Baugh et al.
(Continued)

FOREIGN PATENT DOCUMENTS

CN 102193262 A 9/2011
CN 103176302 A 6/2013
(Continued)

*Primary Examiner* — Matthew Sim
(74) *Attorney, Agent, or Firm* — Alston & Bird LLP

(57) ABSTRACT

A pixel structure is disclosed. The pixel structure includes a substrate, a plurality of scan lines, and a plurality of data lines crossing the scan lines to form pixel unit areas, where the data lines are insulated from the scan lines. The pixel structure also includes a plurality of first electrodes formed in the pixel unit areas, a plurality of second electrodes insulated from the first electrodes and located closer to the substrate than the first electrodes, and a plurality of signal lines located in a same layer as topmost electrodes farthest from the substrate, where the signal lines are arranged to be insulated from the topmost electrodes.

14 Claims, 11 Drawing Sheets

(51) Int. Cl.
  *G02F 1/1335*  (2006.01)
  *G02F 1/1343*  (2006.01)
  *G02F 1/1368*  (2006.01)
  *H01L 27/12*  (2006.01)
  *H05K 1/02*  (2006.01)
  *G02F 1/1333*  (2006.01)

(52) U.S. Cl.
  CPC .. *G02F 1/133514* (2013.01); *G02F 1/134309* (2013.01); *G06F 3/0412* (2013.01); *G09G 3/3659* (2013.01); *G09G 3/3666* (2013.01); *G09G 3/3674* (2013.01); *G09G 3/3685* (2013.01); *H01L 27/124* (2013.01); *H01L 27/1248* (2013.01); *H01L 27/1259* (2013.01); *H05K 1/02* (2013.01); *G02F 2001/134372* (2013.01); *G06F 2203/04101* (2013.01); *G06F 2203/04103* (2013.01); *G09G 2310/0202* (2013.01); *G09G 2310/027* (2013.01); *G09G 2310/0208* (2013.01); *G09G 2310/0218* (2013.01); *G09G 2310/0262* (2013.01); *G09G 2310/0267* (2013.01); *G09G 2320/0613* (2013.01)

(58) Field of Classification Search
  CPC .. G09G 3/3666; G09G 3/3674; G09G 3/3685; G09G 3/36; G06F 2203/04103; G06F 3/0412; H05K 1/02; H01L 27/1248; H01L 27/124; H01L 27/1259
  See application file for complete search history.

(56) References Cited

U.S. PATENT DOCUMENTS

| | | | |
|---|---|---|---|
| 2012/0162558 A1* | 6/2012 | Chung | G02F 1/134363 349/42 |
| 2013/0093706 A1* | 4/2013 | Kurasawa | G06F 3/0412 345/173 |

FOREIGN PATENT DOCUMENTS

| | | |
|---|---|---|
| CN | 103488001 A | 1/2014 |
| CN | 103913904 A | 7/2014 |
| JP | 2011081385 A | 4/2011 |
| KR | 101285686 B1 | 7/2013 |

\* cited by examiner

PIXEL STRUCTURE, DISPLAY PANEL, DISPLAY DEVICE AND METHOD OF FABRICATING THE PIXEL STRUCTURE

CROSS-REFERENCES TO RELATED APPLICATIONS

This application claims the benefit of priority to Chinese Patent Application No. 201410126726.X, filed with the Chinese Patent Office on Mar. 31, 2014 and entitled "Pixel Structure, Display Panel, Display Device and Method of Fabricating the Pixel Structure", the content of which is incorporated herein by reference in its entirety.

TECHNICAL FIELD

The present invention relates to the display field and particularly to a pixel structure, a liquid crystal panel including the pixel structure and a liquid crystal display device including the pixel structure.

BACKGROUND OF THE INVENTION

Liquid crystal display panels and liquid crystal display devices are one part of mainstream display panels at present, and with the popularization of mobile phones with touch panels, navigation systems and other electronic devices in recent years, there are more and more electronic devices with touch panels installed on display elements. There are transmission signal lines and reception signal lines on the touch panel, where the transmission signal lines are transmission terminals used to transmit detection signals, and the reception signal lines are used to receive the values of the detection signals and transfer them to IC for calculation. For an electronic device equipped with a touch panel, corresponding control can be performed by pressing the surface of the touch panel to thereby achieve various functions and effects of the display device, and this direct operation mode has been very popular with people.

With the advancement of technologies, there are increasing demands of people for the display device, where light and thin display devices have become one of current popular trends, and one of the issues researched by people is how to reduce the thickness of the display device under the condition of achieving the same functions.

BRIEF SUMMARY OF THE INVENTION

One inventive aspect is a pixel structure. The pixel structure includes a substrate, a plurality of scan lines, and a plurality of data lines crossing the scan lines to form pixel unit areas, where the data lines are insulated from the scan lines. The pixel structure also includes a plurality of first electrodes formed in the pixel unit areas, a plurality of second electrodes insulated from the first electrodes and located closer to the substrate than the first electrodes, and a plurality of signal lines located in a same layer as topmost electrodes farthest from the substrate, where the signal lines are arranged to be insulated from the topmost electrodes.

Another inventive aspect is a liquid crystal display panel, including a TFT array substrate, a color filter substrate arranged to be opposite the TFT array substrate, and a liquid crystal layer arranged between the TFT array substrate and the color filter substrate. The TFT array substrate includes a pixel structure, and the pixel structure includes a substrate, a plurality of scan lines, and a plurality of data lines crossing the scan lines to form pixel unit areas, where the data lines are insulated from the scan lines. The pixel structure also includes a plurality of first electrodes formed in the pixel unit areas, a plurality of second electrodes insulated from the first electrodes and located closer to the substrate than the first electrodes, and a plurality of signal lines located in a same layer as topmost electrodes farthest from the substrate, where the signal lines are arranged to be insulated from the topmost electrodes.

Another inventive aspect is a method of manufacturing a pixel structure. The method includes providing a substrate, depositing a plurality of TFTs on the substrate, and depositing an insulation layer on the TFTs. The method also includes depositing and etching second electrodes on the insulation layer, depositing an insulation layer on the second electrodes, and depositing first electrodes on the insulation layer, where signal lines out of contact with the first electrodes are etched while the first electrodes are etched.

DETAILED DESCRIPTION OF THE PREFERRED EMBODIMENTS

In order to explain the technical solutions in the embodiments of the invention or in the prior art clearly, the technical solutions in the embodiments of the invention will be described below clearly and fully with reference to the drawings in the embodiments of the invention, and evidently the drawings to be described below are merely illustrative of several embodiments but not all the embodiments of the invention; and all the other embodiments which can be derived by those ordinarily skilled in the art from the embodiments herein of the invention without any inventive effort shall fall into the protection scope of the invention.

At present, display devices with touch panels can be manufactured into in-cell, on-cell and out-cell display devices. In the out-cell product, an external touch panel component can not be integrated with a liquid crystal panel, thus making it very difficult to achieve the thin thickness and light weight of the panel. Moreover, when the touch panel is installed externally to the liquid crystal panel, there is a space between the liquid crystal panel and the touch panel, so extrinsic light and the like may be reflected between the upper surface of the liquid crystal panel and the lower surface of the touch panel, thus reducing the visibility outdoors or in other bright environments. Therefore the integrated manufacturing of the touch panel and the liquid crystal panel has become a hot issue concerned and researched intensively in recent years. It is not difficult to form transparent electrodes between a color filter substrate and a polarizer in the on-cell product, but the technical problems of reducing the thickness and of color non-uniformity in touch control, etc., have not been overcome yet. The in-cell scheme refers to a method of embedding the function of the touch panel into liquid crystal pixels, i.e., embedding the function of a touch sensor into the display panel, thus reducing the thickness and the weight of the panel, but the fabrication process is complicated and thus the yield is low. Therefore, the problem highly concerned is how to simplify the process of manufacturing a display device with a touch panel, to increase the yield thereof and to reduce the cost thereof.

Figure 1:
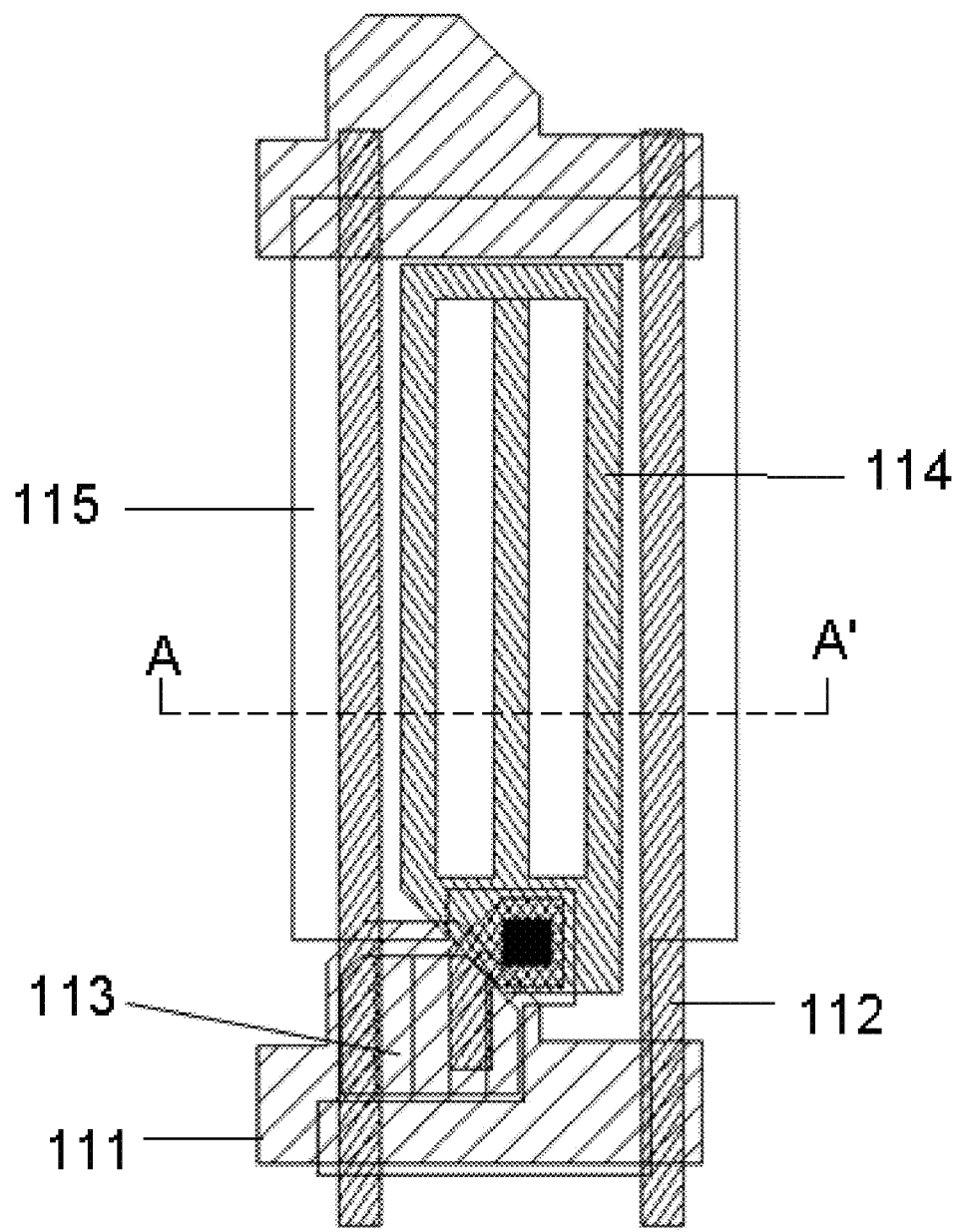
FIG. 1 is a schematic diagram of a top view of a pixel structure in the prior art.
Figure 2:
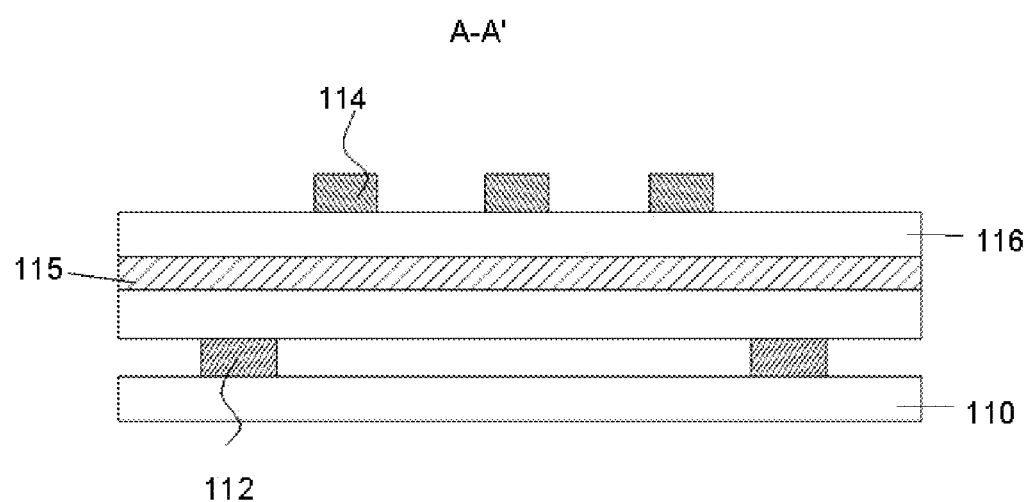
FIG. 2 is a sectional view along A-A' in FIG. 1.

Moreover liquid crystal display modes mainly include Twisted Nematic (TN), Vertical Alignment (VA), IPS (In-Plane Switching), FFS (Fringe Field Switching) types, etc., among which the IPS/FFS type of liquid crystal display panel has been widely used due to its superior wide view angle and other characteristics. FIG. 1 is a schematic diagram of a pixel structure in an FFS type of liquid crystal display panel in the prior art, where the pixel structure includes: scan lines 111; data lines 112 intersecting with and insulated from the scan lines 111; Thin Film Transistors (TFTs) 113 at intersections of the scan lines 111 and the data lines 112; and pixel areas surrounded by the scan lines 111 and the data lines 112. For a specific structure of the pixel structure, reference can be made to FIG. 1 and FIG. 2, where FIG. 2 is a sectional view along A-A' in FIG. 1. As can be seen from FIG. 1 and FIG. 2, the pixel structure includes a plurality of strip-shaped pixel electrodes 114, sheet-shaped common electrodes 115 and an insulation layer 116 arranged between the pixel electrodes 114 and the common electrodes 115 to insulate the pixel electrodes 114 from the common electrodes 115, where electric fields substantially parallel to a substrate 110 are generated between the pixel electrodes 114 and the common electrodes 115. In the pixel structure, capacitors are formed in the areas where the pixel electrodes 114 overlap with the common electrodes 115. With the increasing Pixel Per Inch (PPI) of a product at present, the pixel pitch becomes smaller and smaller and accordingly the pixel storage capacitors become smaller and smaller, and the insufficient storage capacitors may result in numerous adverse phenomena of crosstalk, flicker, etc., in display, which is also one of problems concerned at present.

Figure 3:
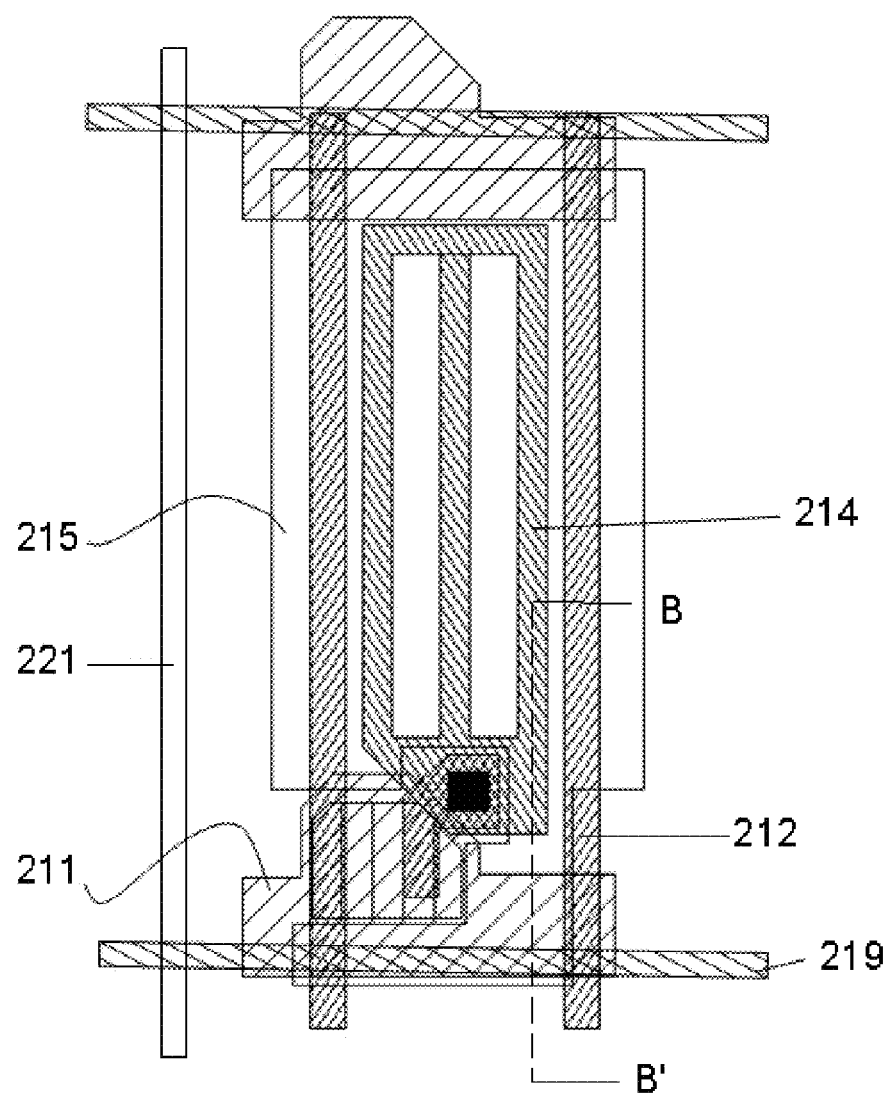
FIG. 3 is a schematic diagram of a top view of a pixel structure according to a first embodiment of the invention.

Referring to FIG. 3, there is a schematic diagram of a pixel structure according to a first embodiment of the invention, and in this embodiment, there are a plurality of scan lines 211 and a plurality of data lines 212 on a substrate, where the scan lines 211 and the data lines 212 are insulated from and intersect with each other to form pixel unit areas.

Figure 4:
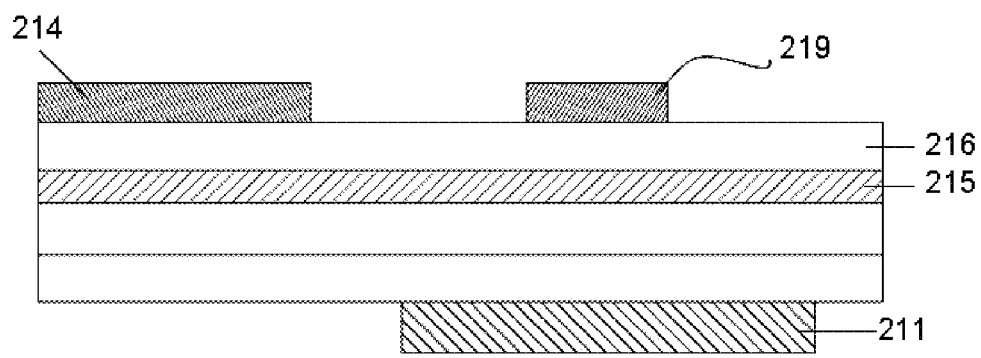
FIG. 4 is a sectional view along B-B' in FIG. 3.

Referring to FIG. 4, FIG. 4 is a sectional view along B-B' in FIG. 3. As can be apparently seen from FIG. 3 and FIG. 4, the pixel structure includes first electrodes 214 and second electrodes 215, where a first insulation layer 216 is arranged between the first electrodes 214 and the second electrodes 215. The first electrodes 214 are located above the first insulation layer 216, and the second electrodes 215 are located below the first insulation layer 216. Electric fields are generated between the first electrodes 214 and the second electrodes 215 to rotate liquid crystal molecules (not illustrated in this figure). Optionally, the first electrodes 214 are strip-shaped, and the second electrodes 215 are sheet-shaped.

Transmission signal lines 219, which are made of the same material as and are insulated from the first electrodes 214, are further arranged at the same layer as the first electrodes 214, and optionally the transmission signal lines 219 are parallel to the scan lines 211 and located between two adjacent pixel units. There is a larger wiring space in the direction of the scan lines as a result of the parallel arrangement. And the transmission signal lines which transmit signal actively will be connected with a fixed scan level or a fixed low level, so there is a higher anti-interference ability due to the arrangement along the direction of the scan lines. It shall be noted that the concept of "parallel" will not be limited to being absolutely parallel but can also be "substantially parallel" in this application. The pitch between the transmission signal lines 219 (i.e., the distance between two adjacent transmission signal lines) is typically set according to the size of a human hand, and the smaller the pitch is, the higher the touch control precision is. Optionally the pitch between the transmission signal lines 219 ranges from 5 mm to 6 mm where the precise touch control can be achieved and the materials can be saved to thereby reduce the power consumption of the device. Optionally the pitch between the transmission signal lines 219 is an integer multiple of the distance between adjacent scan lines, and optionally the multiple ranges from 230 to 275. The transmission signal lines 219 are connected to an IC and further to a touch panel through a traveling line 221, and the transmission signal lines 219 are used to transmit a detection signal. Optionally the transmission signal lines 219 are fabricated in the same fabrication process as the first electrodes 214. In the prior art, the transmission signal lines are fabricated above the first electrodes and insulated from the first electrodes by the insulation layer. In this embodiment, the transmission signal lines 219 and the first electrodes 214 of the touch panel are fabricated on the same layer in the same etching step to thereby simplify the process flow and shorten the process period of time, thus reducing the cost. Moreover as compared with the prior art, an insulation layer and a layer of transmission signal lines can be omitted to thereby reduce the thickness, so that the weight and the thickness of the product fabricated in this embodiment are reduced as compared with the product fabricated in the prior art under the same performance condition.

It shall be noted that the first electrodes 214 and the transmission signal lines 219 in the invention must not be in contact with each other; otherwise, there would be mutual signal interference between them, which makes the display panel unable to function normally.

In one embodiment, optionally the first electrodes 214 are pixel electrodes typically consisted of several strips, and the second electrodes 215 are common electrodes and arranged at an interval to form one or more gaps. In one embodiment, the first electrodes 214 can be common electrodes, and the second electrodes 215 can be pixel electrodes.

The invention further provides a method of manufacturing a pixel structure, where the method includes: providing a substrate, depositing TFTs on the substrate, depositing an insulation layer on the TFTs, depositing and etching second electrodes on the insulation layer, depositing an insulation layer on the second electrodes, and depositing first electrodes on the insulation layer where signal lines out of contact with the first electrodes are etched when the first electrodes are etched, where the insulation layer on the TFTs may not be in direct contact with the second electrodes, and another layer can be presented between them.

Figure 5:
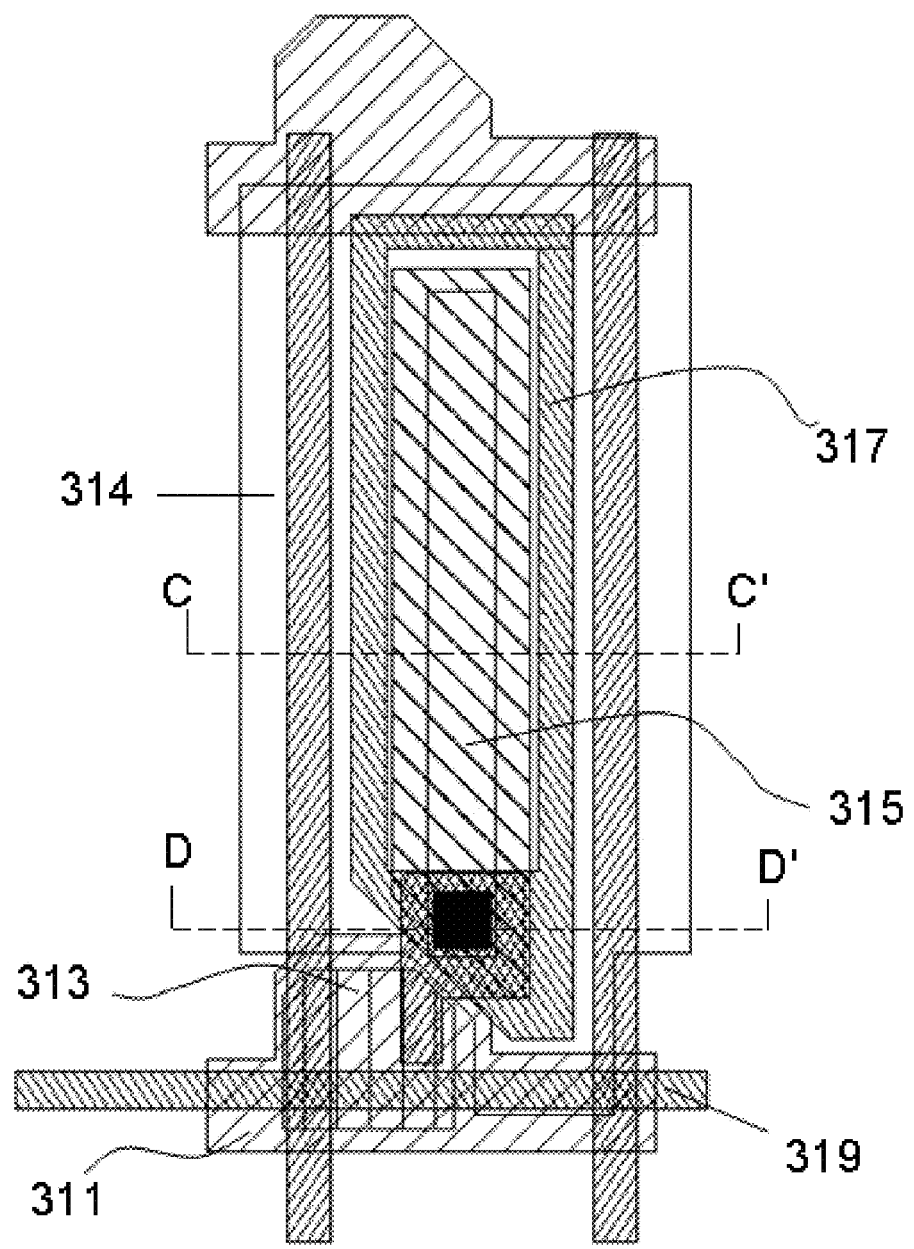
FIG. 5 is a schematic diagram of a top view of a pixel structure according to a second embodiment of the invention.
Figure 6:
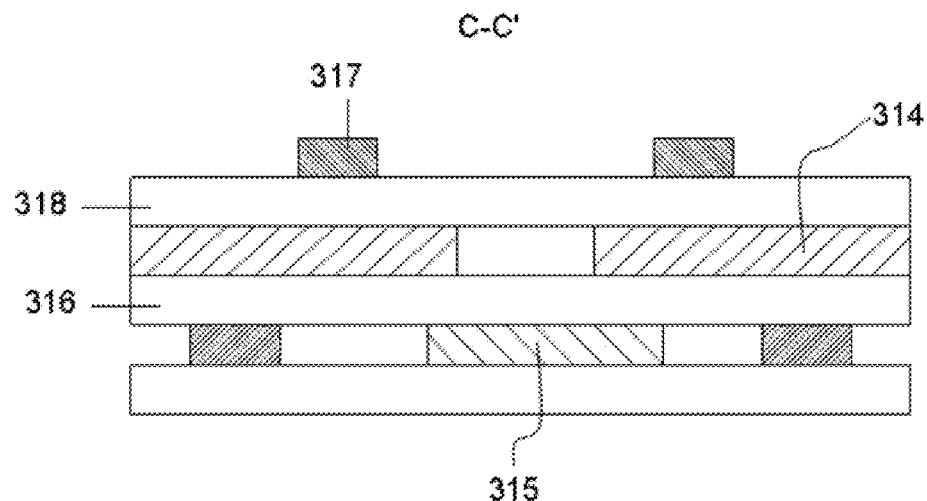
FIG. 6 is a sectional view along C-C' in FIG. 5.
Figure 7:
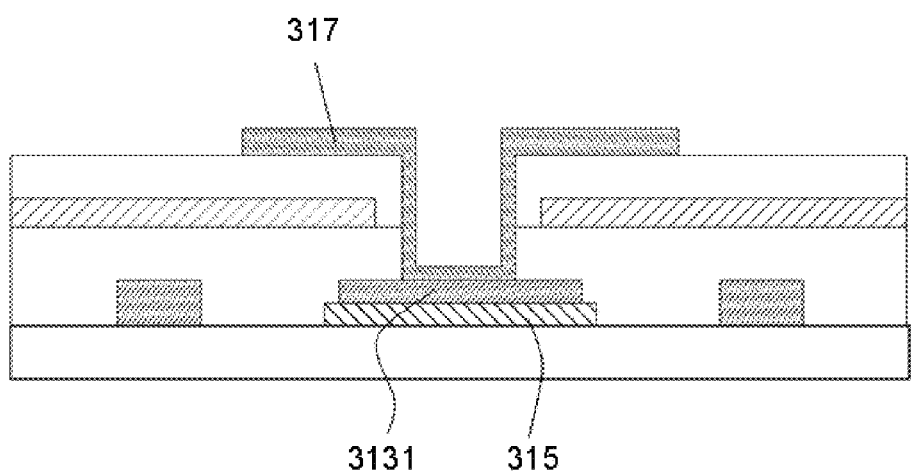
FIG. 7 is a sectional view along D-D' in FIG. 5.

Referring to FIG. 5 and FIG. 6, FIG. 5 and FIG. 6 are schematic diagrams of a pixel structure according to a second embodiment of the invention. In this embodiment, the difference thereof from the first embodiment lies in that the pixel structure further includes third electrodes 317 located above the first electrodes 314 and a second insulation layer 318 arranged between the third electrodes 317 and the first electrodes 314, where the third electrodes 317 have the same potential as the second electrodes 315, and typically the third electrodes 317 are electrically connected with drains 3131 of TFTs 313 through via holes traversing the first insulation layer 316 and the second insulation layer 318 (as illustrated in FIG. 7).

Figure 8:
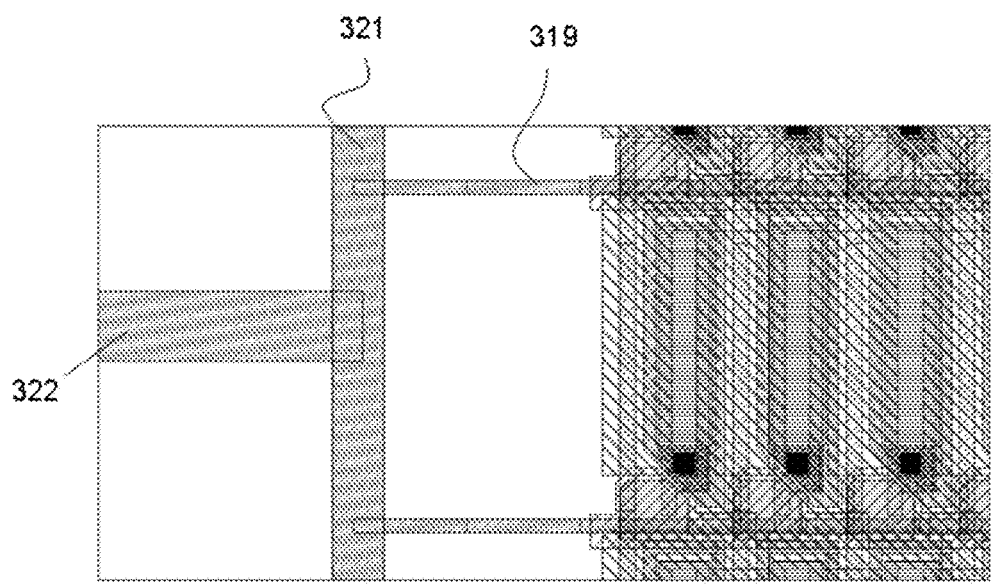
FIG. 8 is a schematic diagram of a top view of the pixel structure according to a second embodiment of the invention.

Referring to FIG. 5 and FIG. 8, similar to the first embodiment, transmission signal lines 319 made of the same material as and out of contact with the third electrodes 317 are further arranged at the same layer as the third electrodes 317, and optionally the transmission signal lines 319 are parallel to the scan lines 311 and located between two adjacent pixel units, where there is a larger wiring space in the direction of the scan lines as a result of the parallel arrangement, and the transmission signal lines to transmit a signal actively will be connected with a fixed scan level or a fixed low level, so there is a higher anti-interference ability due to the arrangement along the direction of the scan lines. It shall be noted that the concept of "parallel" will not be limited to being absolutely parallel but can be further extended to being substantially parallel in this application. The pitch between the transmission signal lines 319 (i.e., the distance between two adjacent transmission signal lines) is typically set according to the size of a human hand, and the smaller the pitch is, the higher the touch control precision is. Optionally the pitch between the transmission signal lines 319 ranges from 5 mm to 6 mm where the precise touch control can be achieved and the materials can be saved to thereby reduce the power consumption of the device. Optionally the pitch between the transmission signal lines 319 is an integer multiple of the distance between adjacent scan lines, and optionally the multiple ranges from 230 to 275. The transmission signal lines 319 are connected to an IC and further to a touch panel through a traveling line 321 and further a main line 322, and the transmission signal lines 319 are used to transmit a detection signal. Optionally the transmission signal lines 319 are fabricated in the same fabrication process as the third electrodes 317.

In this embodiment, the transmission signal lines 319 and the third electrodes 317 of the touch panel can be fabricated in the same process step to thereby simplify the process flow and shorten the process period of time, thus reducing the cost. Additionally in this embodiment, the added third electrodes can increase both transverse electric fields and storage capacitors, and also act as the transmission signal lines of the touch panel.

In this embodiment, the first electrodes 314 may be common electrodes, the second electrodes 315 may be pixel electrodes, and the third electrodes 317 may be pixel electrodes, where the second electrodes 315 and the third electrodes 317 may be strip-shaped electrodes, and the first electrode 314 may be sheet-shaped electrodes arranged at an interval to form one or more gaps. Optionally the third electrodes 317 do not cover gap areas of the first electrodes 314 in the direction perpendicular to the plane of pixel units, and optionally none of the third electrodes 317 covers the gap areas of the first electrodes 314 in the direction perpendicular to the plane of the pixel unit areas. Rotation of liquid crystals is controlled by the transverse electric fields generated by the surfaces of the pixel electrodes and the common electrodes, where liquid crystal molecules will be rotated under the action of the electric field force in such a way that the rotation angle of the liquid crystal molecules is controlled by the electric field force, and the larger the rotation angle is, the higher the light transmittance is. In this embodiment, the third electrodes 317 do not cover the gap areas of the first electrodes 314 in the direction perpendicular to the plane of pixel units so that the electric fields are generated at the liquid crystal layer. If the upper electrodes of the pixel structure cover completely the gap areas of the lower electrodes, then no transverse electric fields can be generated at the liquid crystal layer, and there will be a transverse electric field only between passivation layers, but the transverse electric field between the passivation layers can not control the rotation of the liquid crystals. Similarly, the transverse electric fields will be weakened even if the upper electrodes cover partially the gap areas of the lower electrodes. Therefore the fact that the third electrodes 317 do not cover the gap areas of the first electrodes 314 in the direction perpendicular to the plane of pixel units can increase the transverse electric fields to thereby increase the light transmittance. Optionally the first electrodes 314 and the third electrodes 317 overlap completely or partially in the direction perpendicular to the plane of pixel units to form storage capacitors. The second electrodes 315 and the first electrodes 314 overlap completely or partially in the direction perpendicular to the plane of pixel units to form storage capacitors. The voltage of display units become more stable due to the formed storage capacitors to thereby prevent the occurrence of crosstalk and flicker. Moreover in an appropriate variant of this embodiment, the first electrodes 314 may be pixel electrodes, and the second electrodes 315 and the third electrodes 317 may be common electrodes.

Figure 9A:
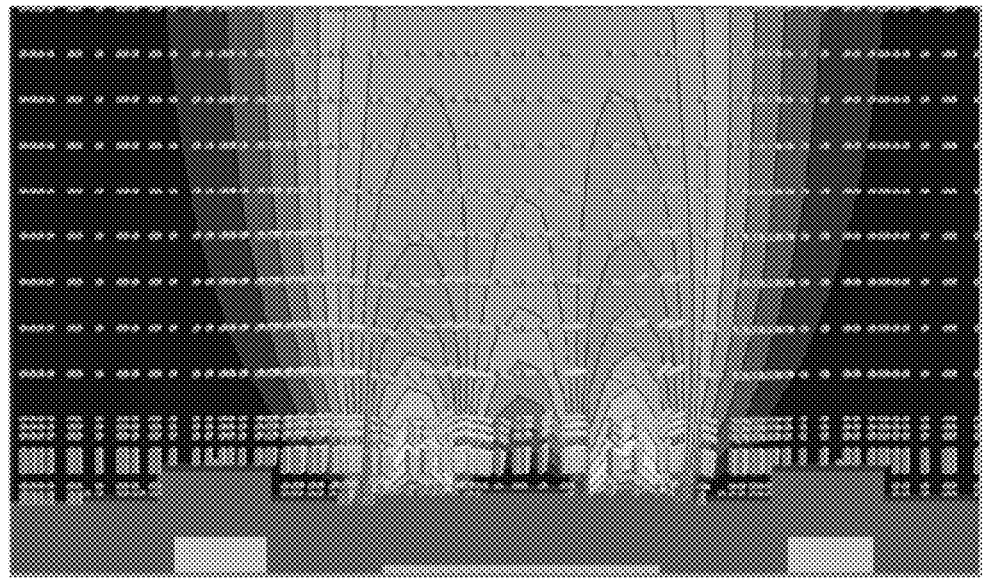
FIGS. 9(a) and 9(b) are schematic diagrams comparing the distribution of transverse electric fields in the pixel structure illustrated in FIG. 1 and the distribution of transverse electric fields in the pixel structure illustrated in FIG. 5.
Figure 9B:
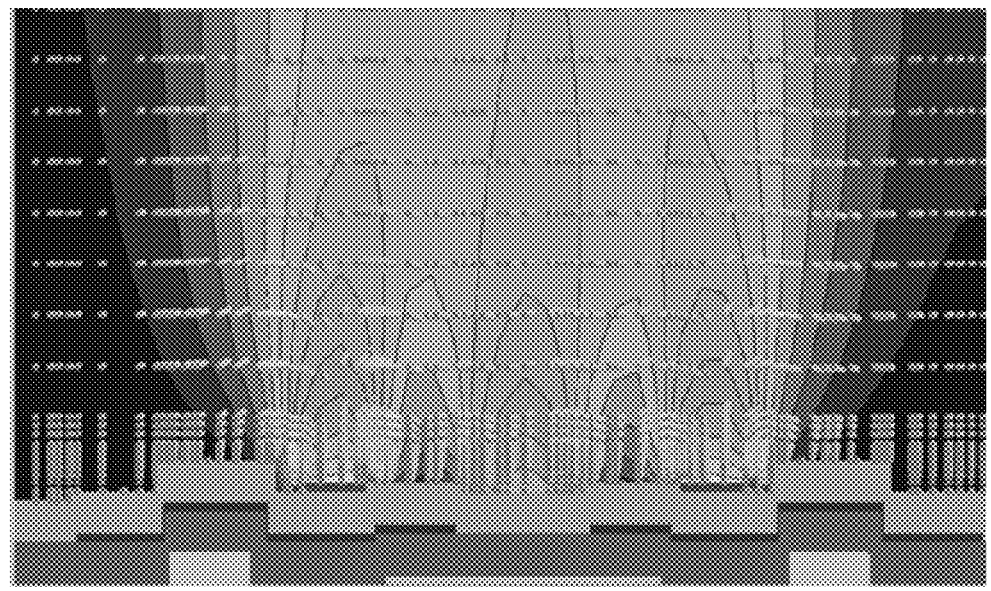

Referring to FIGS. 9(a) and 9(b), FIGS. 9(a) and 9(b) are schematic diagrams of the intensity comparison of electric fields generated in this embodiment and in the prior art, where FIG. 9(a) illustrates a distribution diagram of transverse electric fields generated in the prior art, and FIG. 9(b) illustrates a distribution diagram of transverse electric fields generated in this embodiment. As can be apparently seen, there are four transverse electric fields in the prior art and there are six transverse electric fields in this embodiment. As can be apparently seen, the adding of the third electrodes in this embodiment has significantly improved the electric fields, and the pixel structure according to this embodiment has higher light transmittance.

The invention further provides a method of manufacturing a pixel structure, where the method includes: providing a substrate, depositing TFTs on the substrate, depositing an insulation layer on the TFTs, depositing and etching second electrodes on the insulation layer, depositing a first insulation layer on the second electrodes, depositing first electrodes on the first insulation layer, depositing a second insulation layer on the first electrodes, and depositing third electrodes on the second insulation layer, where signal lines out of contact with the third electrodes are etched when the third electrodes are etched.

Similarly the invention can also be extended to a pixel structure including four or more layers of electrodes, where the structure including four or more layers of electrodes can be fabricated simply by repeating the process steps based on the invention without any inventive effort, thus falling into the scope of the invention as long as the top electrodes and the signal lines of the touch panel are fabricated in the same process step.

Figure 10:
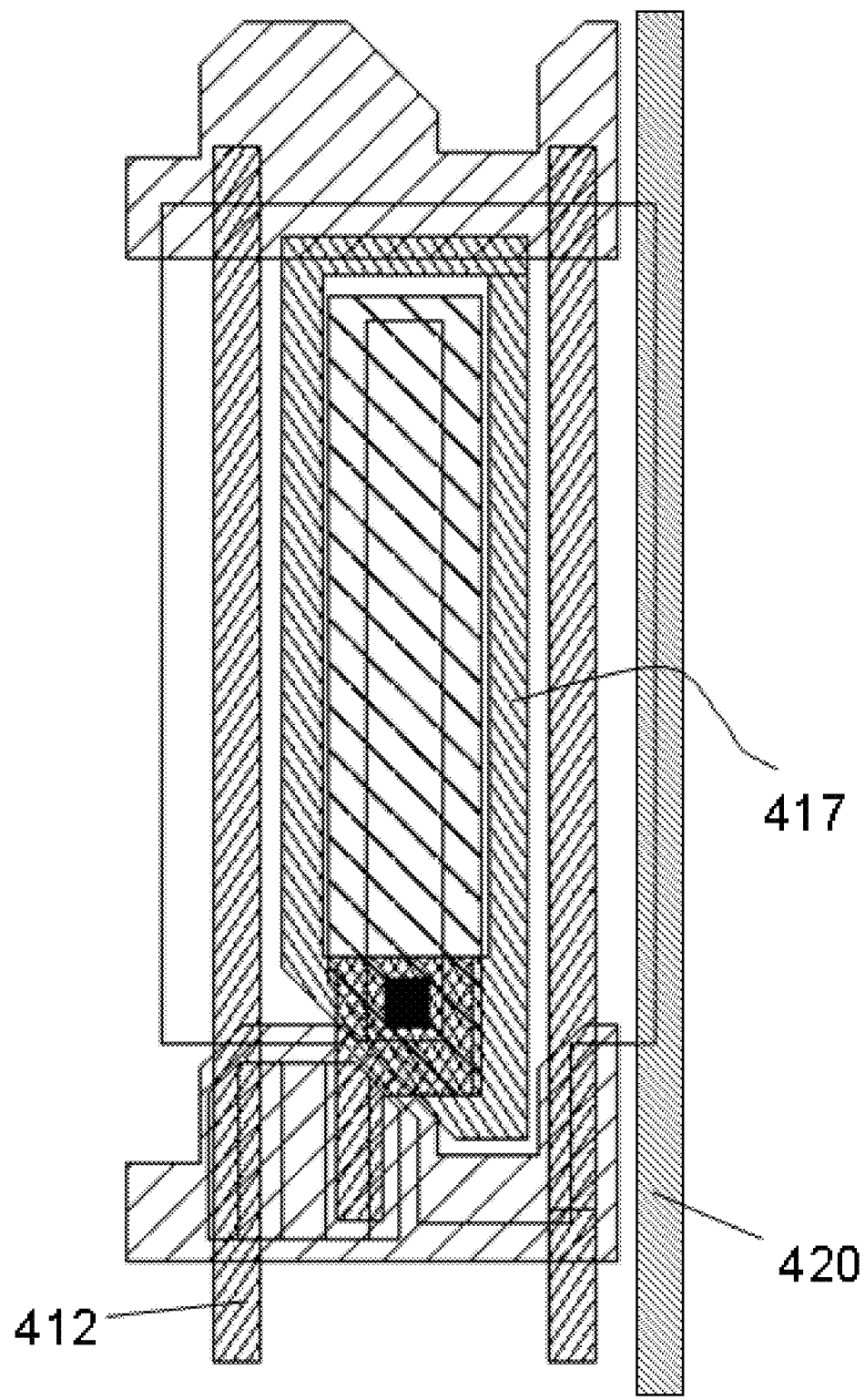
FIG. 10 is a schematic diagram of a top view of a pixel structure according to a third embodiment of the invention.

Referring to FIG. 10, FIG. 10 is a schematic diagram of a pixel structure according to a third embodiment of the invention, where the difference thereof from the second embodiment lies in that reception signal lines 420 made of the same material as and out of contact with third electrodes 417 are arranged at the same layer as the third electrode 417 so that the reception signal lines 420 of the touch panel can be fabricated in the same process step as the third electrodes 417 to thereby simplify the process flow and shorten the process period of time, thus reducing the cost. Optionally the reception signal lines 420 are parallel to data lines 412, and it shall be noted that the concept of "parallel" will not be limited to being absolutely parallel but can be further extended to being substantially parallel in this application. The pitch between the reception signal lines 420 (i.e., the distance between two adjacent reception signal lines) is an integer multiple of the distance between adjacent data lines. The reception signal lines 420 are used to receive the value of the detection signal of the touch panel and transfer it to an IC for calculation. Optionally the reception signal lines 420 and the third electrodes 417 are fabricated in the same fabrication process.

Figure 11:
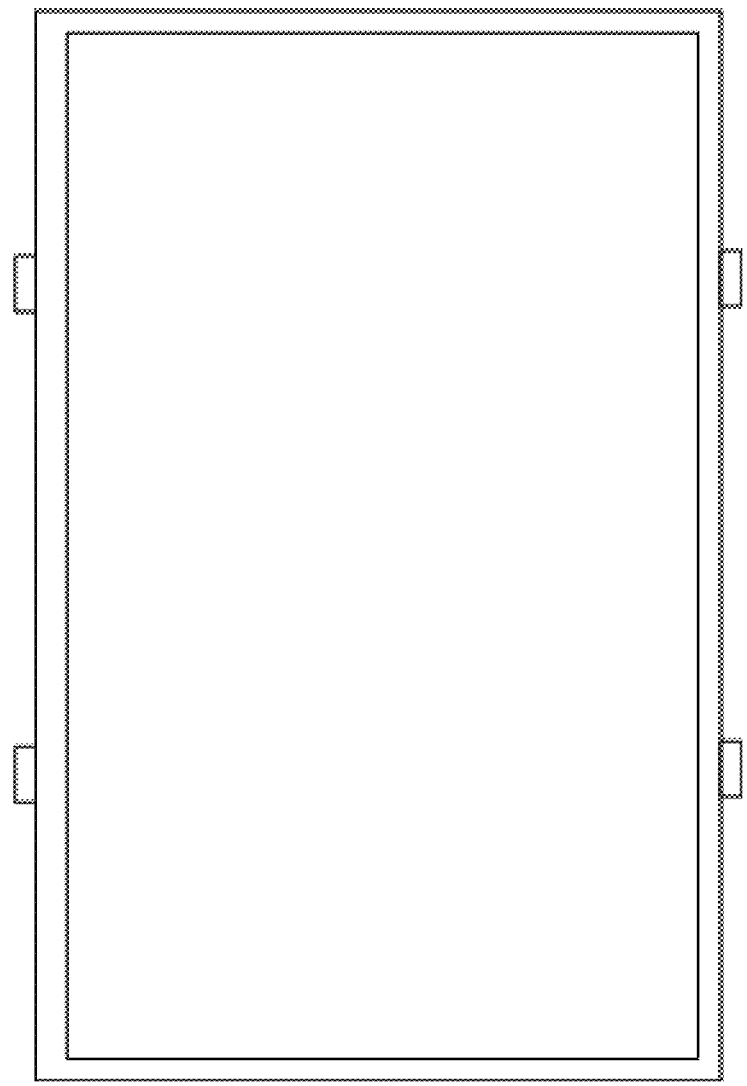
FIG. 11 is a schematic diagram of a panel according to an embodiment of the invention.

Referring to FIG. 11, the invention further provides a liquid crystal display panel including: a TFT array substrate; a color filter substrate arranged opposed to the TFT array substrate (not illustrated in this figure); and a liquid crystal layer arranged between the TFT array substrate and the color filter substrate; where the TFT array substrate includes the pixel structure described in any one of the above embodiments.

Figure 12:
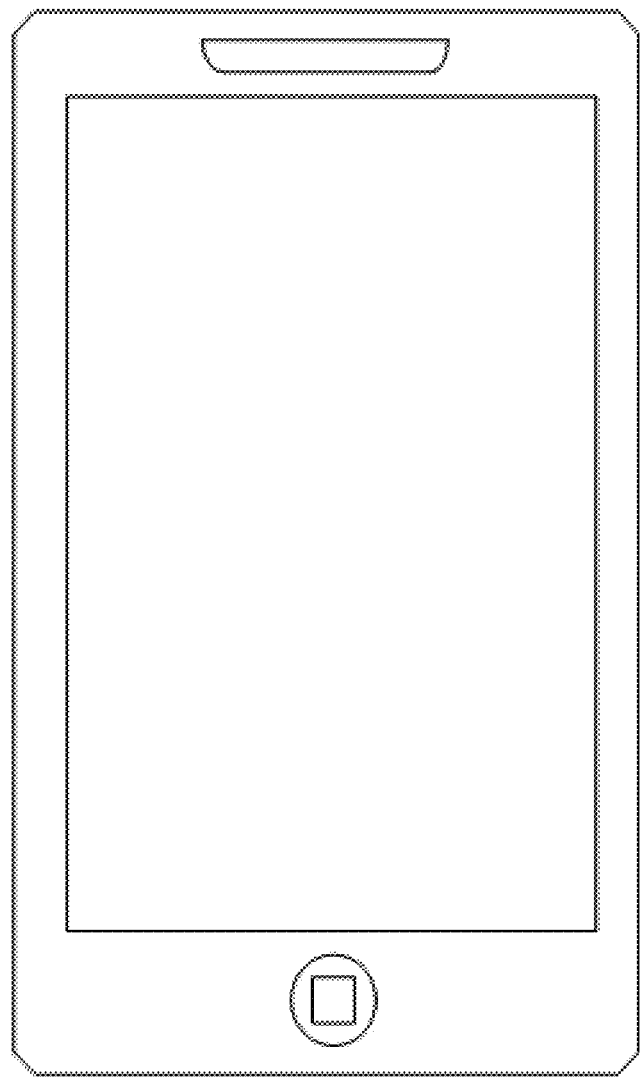
FIG. 12 is a schematic diagram of a display device according to an embodiment of the invention.

Referring to FIG. 12, the invention further provides a liquid crystal display device, which can include the liquid crystal display panel described in any one of the above embodiments.

In the application, the strip shape can be straight strip shape, V shape or broken line shape or the like.

Optionally all the materials of the first electrodes, the second electrodes and the transmission signal lines are transparent conductive materials, which may be ITO.

Evidently those skilled in the art can make various modifications and variations to the invention without departing from the spirit and scope of the invention. Thus the invention is also intended to encompass these modifications and variations thereto as long as the modifications and variations come into the scope of the claims appended to the invention and their equivalents.

What is claimed is:

1. A pixel structure, comprising:
a substrate;
a touch panel over the substrate;
a plurality of scan lines on the substrate;
a plurality of data lines crossing over the plurality of scan lines to form pixel unit areas, wherein the data lines are insulated from the scan lines;
a plurality of first electrodes formed in the pixel unit areas;
a plurality of second electrodes formed between the substrate and the plurality of the first electrodes, wherein the second electrodes are insulated from the first electrodes by a first insulating layer;
a second insulating layer disposed directly on the plurality of first electrodes; and
a conductive layer comprising a plurality of third electrodes and a plurality of signal lines disposed directly on the second insulating layer;
wherein the third electrodes have a same potential as the second electrodes;
wherein the plurality of signal lines are insulated from the plurality of third electrodes, and
wherein the plurality of signal lines serve as reception signal lines of the touch panel used to receive a value of a detection signal and transmission signal lines of the touch panel used to transmit the detection signal.

2. The pixel structure according to claim 1, wherein the first electrodes are pixel electrodes, and the second electrodes are common electrodes.

3. The pixel structure according to claim 1, wherein the first electrodes are strip-shaped, and the second electrodes are sheet-shaped.

4. The pixel structure according to claim 1, wherein the signal lines are arranged to be parallel to the scan lines.

5. The pixel structure according to claim 1, wherein the first electrodes are sheet-shaped, the second electrodes are strip-shaped, and the third electrodes are strip-shaped.

6. The pixel structure according to claim 1, wherein the first electrodes and the third electrodes at least partially overlap in a direction perpendicular to a plane defined by the pixel unit areas.

7. The pixel structure according to claim 1, wherein the first electrodes and the second electrodes at least partially overlap in a direction perpendicular to a plane defined by the pixel unit areas.

8. The pixel structure according to claim 1, wherein the first electrodes are arranged at an interval to form one or more gaps, wherein the third electrodes do not cover gap areas of the first electrodes in a direction perpendicular to a plane defined by the pixel unit areas.

9. The pixel structure according to claim 8, wherein none of the third electrodes covers the gap areas of the first electrodes in the direction perpendicular to the plane defined by the pixel unit areas.

10. The pixel structure according to claim 1, wherein the first electrodes are common electrodes, the second electrodes are pixel electrodes, and the third electrodes are pixel electrodes.

11. The pixel structure according to claim 1, wherein the first electrodes, the second electrodes, and the third electrodes each comprise transparent conductive materials.

12. The pixel structure according to claim 1, wherein a distance between adjacent ones of the signal lines is an integer multiple of a distance between adjacent ones of the scan lines.

13. A method of manufacturing the pixel structure of claim 1, the method comprising:
providing the substrate;
depositing the plurality of TFTs on the substrate;
depositing the insulation layer on the TFTs;
depositing and etching the second electrodes on the insulation layer;
depositing the insulation layer on the second electrodes; and
depositing the first electrodes on the insulation layer, wherein the plurality of signal lines out of contact with the first electrodes are etched while the first electrodes are etched.

14. A liquid crystal display panel, comprising:
a TFT array substrate;
a color filter substrate arranged to be opposite the TFT array substrate; and
a liquid crystal layer arranged between the TFT array substrate and the color filter substrate, wherein the TFT array substrate comprises a pixel structure,
wherein the pixel structure comprises:
a substrate;

a touch panel over the substrate;
a plurality of scan lines on the substrate;
a plurality of data lines crossing over the plurality of scan lines to form pixel unit areas, wherein the data lines are insulated from the scan lines;
a plurality of first electrodes formed in the pixel unit areas;
a plurality of second electrodes formed between the substrate and the plurality of the first electrodes, wherein the second electrodes are insulated from the first electrodes by a first insulating layer;
a second insulating layer disposed directly on the plurality of first electrodes; and
a conductive layer comprising a plurality of third electrodes and a plurality of signal lines disposed directly on the second insulating layer,
wherein the third electrodes have a same potential as the second electrodes,
wherein the plurality of signal lines are insulated from the plurality of third electrodes, and
wherein the plurality of signal lines serve as reception signal lines of the touch panel used to receive a value of the detection signal and transmission signal lines of the touch panel used to transmit a detection signal.

\* \* \* \* \*